(12) United States Patent
Li et al.

(10) Patent No.: US 9,685,468 B2
(45) Date of Patent: Jun. 20, 2017

(54) COLOR FILTER SUBSTRATE, DISPLAY DEVICE AND DETECTING METHOD THEREFOR

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Tiansheng Li, Beijing (CN); Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/906,348

(22) PCT Filed: Aug. 14, 2015

(86) PCT No.: PCT/CN2015/087025
§ 371 (c)(1),
(2) Date: Jan. 20, 2016

(87) PCT Pub. No.: WO2016/107187
PCT Pub. Date: Jul. 7, 2016

(65) Prior Publication Data
US 2016/0329354 A1 Nov. 10, 2016

(30) Foreign Application Priority Data

Jan. 4, 2015 (CN) .......................... 2015 1 0002242

(51) Int. Cl.
*H01L 27/14* (2006.01)
*H01L 27/12* (2006.01)
(Continued)

(52) U.S. Cl.
CPC .......... *H01L 27/1244* (2013.01); *G02B 5/201* (2013.01); *G02F 1/1335* (2013.01);
(Continued)

(58) Field of Classification Search
CPC ........................... H01L 27/1214; H01L 27/12
(Continued)

(56) References Cited

U.S. PATENT DOCUMENTS

| 6,143,450 A | 11/2000 | Sobue et al. |
| 2002/0057401 A1 | 5/2002 | Ito |

(Continued)

FOREIGN PATENT DOCUMENTS

| CN | 1773338 A | 5/2006 |
| CN | 101699337 A | 4/2010 |

(Continued)

OTHER PUBLICATIONS

International Search Report dated Oct. 30, 2015 corresponding to International application No. PCT/CN2015/087025.
(Continued)

*Primary Examiner* — Jami M Valentine
(74) *Attorney, Agent, or Firm* — Nath, Goldberg & Meyer; Joshua B. Goldberg

(57) ABSTRACT

The present invention provides a color filter substrate, a display device and a detection method thereof, aims to solve the problems of difficulty in failure positioning and low detection efficiency in existing display panels. The color filter substrate comprises a plurality of sub-pixels arranged in an array, each of the sub-pixels is provided with a color filter, and at least a part of columns of sub-pixels are marked column of sub-pixels. The shapes of the color filters of a part of sub-pixels of the marked column of sub-pixels are different from those of the remaining sub-pixels. The display device comprises the above-mentioned color filter substrate.

(Continued)

The color filter substrate can be used in the display device, particularly suitable for the display device which adopts double side GOA circuits.

20 Claims, 2 Drawing Sheets

(51) Int. Cl.
    *G02F 1/1335*     (2006.01)
    *G09G 3/00*     (2006.01)
    *G02B 5/20*     (2006.01)

(52) U.S. Cl.
    CPC .......... *G09G 3/00* (2013.01); *H01L 27/1296* (2013.01); *G09G 2330/10* (2013.01)

(58) Field of Classification Search
    USPC .......................................................... 257/72
    See application file for complete search history.

(56) References Cited

U.S. PATENT DOCUMENTS

2006/0038953 A1* 2/2006 Moriya ............. G02F 1/133514
    349/144

2016/0133675 A1* 5/2016 Yata .................... H01L 27/3218
    257/89
2016/0216580 A1* 7/2016 Ishii ....................... G02B 5/201

FOREIGN PATENT DOCUMENTS

| | | |
|---|---|---|
| CN | 102692723 A | 9/2012 |
| CN | 202948155 U | 5/2013 |
| CN | 103176306 A | 6/2013 |
| CN | 103424916 A | 12/2013 |
| CN | 103424923 A | 12/2013 |
| CN | 203365857 U | 12/2013 |
| CN | 104483777 A | 4/2015 |
| CN | 204302624 U | 4/2015 |
| JP | 2008180927 A | 8/2008 |
| KR | 20030058198 A | 7/2003 |

OTHER PUBLICATIONS

Written Opinion of the International Searching Authority dated Oct. 30, 2015 corresponding to International application No. PCT/CN2015/087025.

The First Office Action dated Oct. 9, 2016 corresponding to Chinese application No. 201510002242.9.

\* cited by examiner

COLOR FILTER SUBSTRATE, DISPLAY DEVICE AND DETECTING METHOD THEREFOR

This is a National Phase Application filed under 35 U.S.C. 371 as a national stage of PCT/CN2015/087025, filed Aug. 14, 2015, an application claiming the benefit of Chinese Application No. 201510002242.9, filed Jan. 4, 2015 the content of each of which is hereby incorporated by reference in its entirety.

FIELD OF THE INVENTION

The present invention belongs to a detecting technology field of a display device, and particularly relates to a color filter substrate, a display device and a detecting method thereof.

BACKGROUND OF THE INVENTION

GOA (Gate Driver On Array) circuit means a gate line driving circuitry which is directly manufactured on an array substrate. GOA circuit comprises multistage of shift registers sequentially connected. Each shift register drives a gate line and provides a turn-on signal for the shift register in the next stage, thus GOA circuit can achieve the aim of conducting the gate lines one by one overall. Considering the space occupy aspect etc., some display devices adopt double side GOA circuits, i.e. a GOA circuit is provide at each of both sides of the array substrate respectively, and the GOA circuits are respectively used to drive odd rows and even rows of gate lines.

When certain position of GOA circuit presents failures such as being shortened or broken, each stage of the shift registers following the failure position is incapable of working normally, thereby causing display abnormality. For a display panel adopting double side GOA circuits, if the GOA circuit at either side occurs failure, then as shown in FIG. 1, the following sub-pixels appears interlaced poor display (also called "split screen poor display") from the certain position of the display panel. When this phenomenon appears, it can be known that, the GOA circuit at a side occurs failure, but because there are a large number of rows of sub-pixels, it is impossible to determine that the failure is appeared in odd rows or even rows of sub-pixels, that is, it is impossible to determine that which GOA circuit occurs failure. Therefore, during the detection process, the display panel must has to be disassembled to analyze and detect both the sides of the GOA circuits at two sides, thus causing the difficulty in failure positioning and low detection efficiency.

SUMMARY OF THE INVENTION

In view of the difficulty in failure positioning and the low detection efficiency for display panels in the prior art, the present invention provides a color filter substrate, a display device and a detecting method thereof which can quickly position the failure.

The technical solution which solves the technical problem by the present invention is a color filter substrate, which comprises a plurality of sub-pixels arranged in an array, each of which is provided with a color filter, and at least a part of columns of sub-pixels are marked column of sub-pixels. The shapes of the color filters of a part of sub-pixels of the marked column of sub-pixels are different from those of the remaining sub-pixels.

The term "column" in the present invention means an arrangement direction of sub-pixels, which is vertical with the term "row". It should be understood that the row and column here are relative directions according to the arrangement of sub-pixels, and therefore they are not affected by shapes, arrangement forms, observation angle and the like of the color filter substrate itself.

Preferably, a part of the sub-pixels of the marked column of sub-pixels are standard sub-pixels, the remaining sub-pixels are marked sub-pixels, and the shapes of the color filters of the standard sub-pixels are the same.

Further preferably, in the marked column of sub-pixels, at least one marked sub-pixel is provided every N standard sub-pixels, wherein N is a positive integer.

Further preferably, N is 1, and one marked sub-pixel is provided every one standard sub-pixel.

Further preferably, the marked sub-pixels are divided into at least two types, and the shapes of the color filters of the marked sub-pixels of different types are different.

Further preferably, the shapes of the color filters of the marked sub-pixels are the same.

Further preferably, sub-pixels other than those in the marked column of sub-pixels are standard sub-pixels.

Preferably, the number of the marked column of sub-pixels is of a column.

Further preferably, the marked column of sub-pixels is one of the two columns of sub-pixels at the outermost of the color filter substrate.

Preferably, the colors of the color filters of the same column of sub-pixels are the same.

The technical solution which solves the technical problem by the present invention is a display device, comprising the above color filter substrate.

Preferably, the display device further comprises an array substrate to be assembled with the color filter substrate. The array substrate comprises a plurality of gate lines and two GOA circuits, each gate line corresponds to a row of sub-pixels of the color filter substrate, one of the two GOA circuits drives the gate lines of odd rows, and the other drives the gate lines of even rows, and the color filter substrate is the color filter substrate including the marked column of sub-pixels in which the above standard sub-pixels and marked sub-pixels are arranged alternately.

The technical solution which solves the technical problem by the present invention is a detecting method for a display device, the display device is the above display device which adopts double side GOA circuits, the detecting method specifically comprises: during the detection process, odd rows and even rows of the display device are distinguished through the marked sub-pixels of the marked column of sub-pixels.

The color filter substrate of the present invention can be used in the display device, particularly suitable for the display device which adopts double side GOA circuits.

DESCRIPTION OF THE PREFERRED EMBODIMENT

The present invention is further described in detail in combination with drawings and detailed description below, so that those skilled in the art can better understand the technical solution of the present invention.

Figure 1:
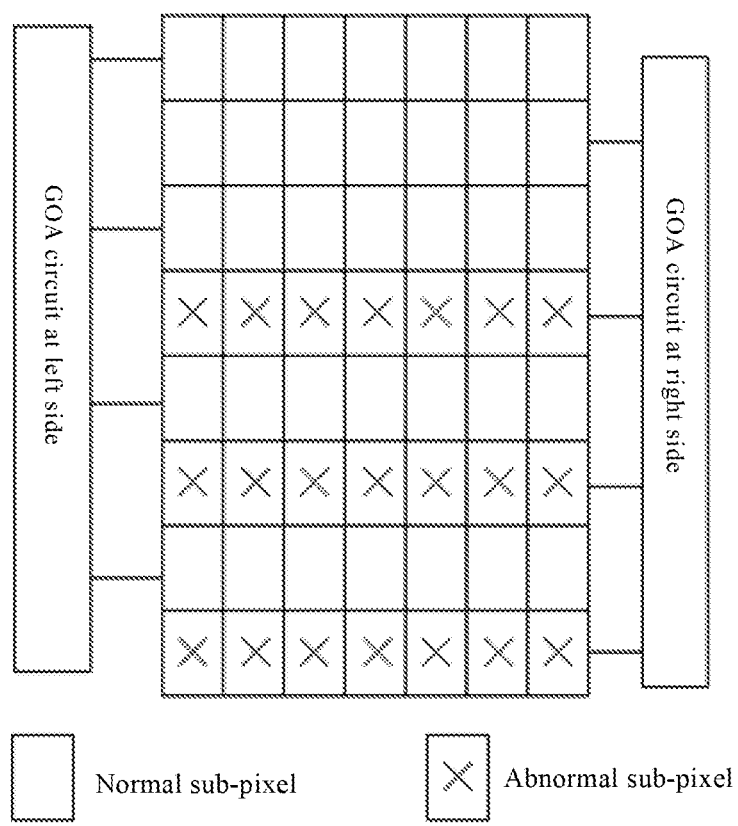
FIG. 1 is a schematic diagram illustrating an existing display panel appearing interlaced abnormality.
Figure 2:
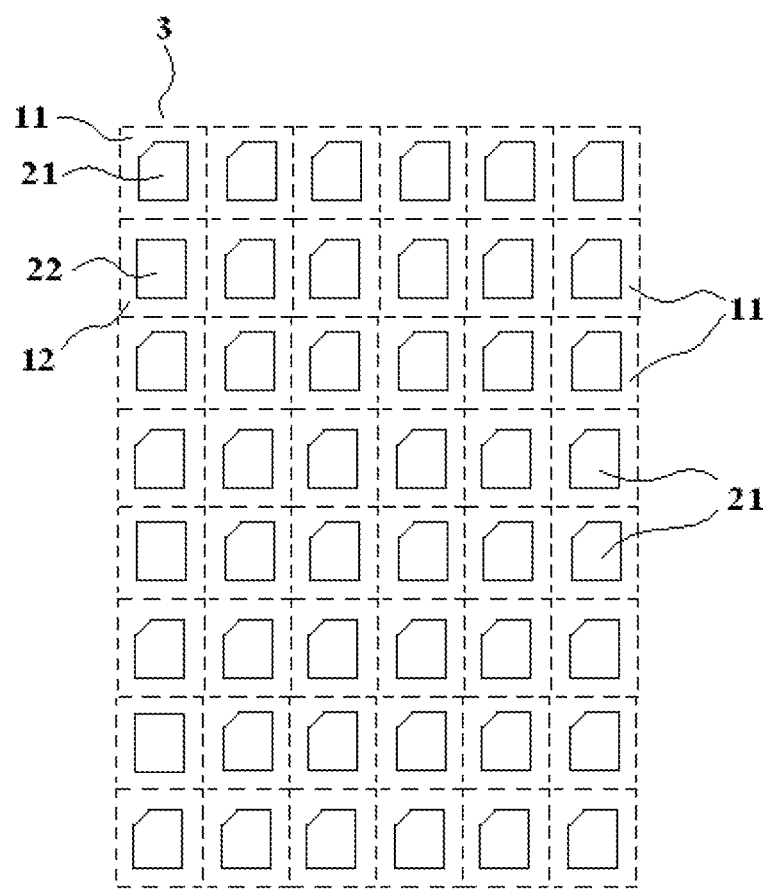
FIG. 2 is a schematic diagram of a structure of a color filter substrate in an embodiment of the present invention.

As shown in FIG. 2, one embodiment of the present invention provides a color filter substrate, comprising a plurality of sub-pixels arranged in an array, each of which is provided with a color filter.

The color filter substrate comprises a plurality of sub-pixels. After the color filter substrate constitutes the display device, every sub-pixel corresponds to a sub-pixel of the display device. Each sub-pixel of the color filter substrate comprises a color filter and a black matrix around the color filter. The color filter is used to change the light transmitted therethrough into a corresponding color, while black matrix is used to prevent undesirable light from transmitting.

For instance, the colors of the color filters of the same column of sub-pixels are the same.

That is, the sub-pixels in same columns may have the same color, which is easy for the preparation of the color filters, and the rows of the sub-pixels cannot be distinguished through color when a column of sub-pixels are same in color, the solution of this embodiment is more suitable for thus color filter substrate.

In the color filter substrate of this embodiment, at least a part of columns of sub-pixels are marked column of sub-pixels 3. In the marked column of sub-pixels 3, the shapes of the color filters of a part of sub-pixels are different from those of the remaining sub-pixels in the column.

In an existing color filter substrate, the shapes of the color filters of all sub-pixels are the same (of course, the color may be different), therefore various rows cannot be distinguished, causing difficulty in failure positioning. While as shown in FIG. 2, in the color filter substrate of this embodiment, sub-pixels in at least a part of the columns are "marked column of sub-pixels 3". In these marked columns, the shapes of the color filters of at least a part of sub-pixels are different from those of the remaining sub-pixels. Therefore, it can be determined that which rows these sub-pixels with different shapes are located by taking them as marking points, thus performing failure positioning. Of course, in other sub-pixels of "no marking column", the shapes of the color filters of all sub-pixels in the same column are the same.

Obviously, considering of decreasing influence on display effects, the difference of the shapes between the above color filters should be as small as possible, so long as the shapes can be distinguished by using a microscope. For instance, as shown in FIG. 2, the color filters 21 of the standard sub-pixels are rectangles with broken corner, while the color filters 22 of the marked sub-pixels are complete rectangle.

Of course, in this embodiment, the difference of the shapes of the color filters is not limited thereto. For instance, other additional marking (such as small triangle, small circle shape, small star etc.) may be overlaid at a portion of the color filter of a certain sub-pixel, thus the shape of the color filter of the certain sub-pixel is different from those of other sub-pixels. Again for example, a part of the color filter of a certain sub-pixel can be "cut away", and into which other color filter is filled, in this way, the shape of the color filter of the certain sub-pixel can also be different. Anyway, of two sub-pixels, as long as the structures of all the color filters (excluding the colors) are not the same, the shapes of the color filters of the two sub-pixels can be considered to be different.

For instance, the part of sub-pixels of the marked column of sub-pixels 3 are standard sub-pixels 11, the remaining sub-pixels are marked sub-pixels 12. For instance, the remaining sub-pixels except the marked column of sub-pixels 13 are the standard sub-pixels 11. The shapes of the color filters of the standard sub-pixels 11 are the same, while the shapes of the color filters 22 of the marked sub-pixels 12 are different from those of the color filters 21 of the standard sub-pixels 11.

Obviously, the change of the shape of the color filter will affect the display effect, in order to decrease the affect on the display effect by the change of the shape of the color filter as much as possible, in this embodiment, for instance, most of sub-pixels in the color filter substrate can still be common sub-pixels (standard sub-pixels 11), and the shapes of the color filters 21 of these standard sub-pixels are the same, which will not affect the display effect. The remaining sub-pixels are the marked sub-pixels 12 used for distinguishing, the shapes of the color filters 22 of the marked sub-pixels 12 are different from those of the color filters 21 of the standard sub-pixels 11, and thus they can be distinguished.

For instance, the shapes of the color filters 22 of the marked sub-pixels 12 are the same.

Obviously, when the shapes of the color filters 22 of the marked sub-pixels 12 are the same, the marked sub-pixels 12 can still play the distinguishing role. Meanwhile, such marked sub-pixels 12 are easy to manufacture and have the smallest affect on the display effect.

For instance, as another way in the embodiment, the marked sub-pixels 12 are divided into at least two types, and the shapes of the color filters 22 of different types of the marked sub-pixels 12 are different.

That is, the shapes of the color filters 22 of sub-pixels 12 may be not the same. For instance, if the color filters 21 of the standard sub-pixels 11 are the rectangles with broken corner, shapes of the color filters 22 of some marked sub-pixels 12 may be complete rectangles, shapes of the color filters 22 of some marked sub-pixels 12 may be rectangles, each of which is provided with a piece lacking on one side thereof, and additional markings may be provided on portions of the color filters 22 of some marked sub-pixels 12. A better distinguishing effect can be achieved through the mixture use of a plurality of marked sub-pixels 12. For instance, if the marked sub-pixels 12 are divided into a first type and a second type, in the color filter substrate, the standard sub-pixels 11 can correspond to the $3M^{th}$ rows (M is a positive integer), the first type of the marked sub-pixels 12 correspond to the $(3M+1)^{th}$ rows, the second type of marked sub-pixels 12 correspond to the $(3M+2)^{th}$ rows.

For instance, in the marked column of sub-pixels 3, at least one marked sub-pixel 12 is set every N standard sub-pixels 11.

In the embodiment, for instance, in the marked column of sub-pixels 3, one marked sub-pixel 12 may be set every N standard sub-pixels 11. Thus, as long as the number of N is not too large, different rows can be determined by using the marked sub-pixels 12 as references. For instance, if N=3, and the marked sub-pixels 12 are located in the $4M^{th}$ row (M is a positive integer), the standard sub-pixels 11 are located in the following first row, i.e. the $(4M+1)^{th}$ row, the following second row, i.e. the $(4M+2)^{th}$ row, the following third row, i.e. the $(4M+3)^{th}$ row. The above solution is preferably adopted, since sufficient distinguishing effect can be achieved by means of the simplest form of the marked sub-pixels 12 (the shapes of the color filters 22 of all sub-pixels are the same).

For instance, the above N is 1, and one marked sub-pixel 12 is set every one standard sub-pixel 11. That is, the marked column of sub-pixels 3 can be arranged one by one alternatively in the way of "standard sub-pixel 11-marked sub-pixel 12-standard sub-pixel 11-marked sub-pixel 12". In this way, in the marked column of sub-pixels 3, all the standard sub-pixels 11 or all the marked sub-pixels 12 are certainly located in odd rows, and the other ones are located in even rows. The most frequently-used situation which needs to distinguish rows is that during the detection process of the display device which adopts double side GOA circuits, the odd and even rows are required to be distinguished, while the above color filter substrate can achieve the aim by the most simple structure.

Of course, the display device may also need to distinguish rows in other ways, at this time, the marked sub-pixels 12 can be correspondingly adjusted.

For instance, if each of the both sides of the display device has two GOA circuits respectively, the gate lines may be driven on a basis of 4 gate lines, that is, the 4 gate lines forms a cycle. Correspondingly, at this time the way that the above N=3 can be adopted, that is, one marked sub-pixel 12 presents in every 4 rows by which other rows can be indirectly determined. Alternatively, the form that the above marked sub-pixels 12 are divided into many types may be adopted, for instance, three different types of the marked sub-pixels 12 may be provided which correspond to the $(4M+1)^{th}$ row, the $(4M+2)^{th}$ row, and the $(4M+3)^{th}$ row respectively, while the standard sub-pixels 11 correspond to the $4M^{th}$ row, thus the rows which each GOA circuit corresponds to can be completely distinguished.

Specifically, many different cases in which the rows can be distinguished can be achieved by arranging the positions and types and the like of the marked sub-pixels 12 in combination, which are not described in detail here.

For instance, the number of the marked column of sub-pixels 3 is of a column. For instance, the marked column of sub-pixels 3 is one of the two columns of sub-pixels at the outermost of the color filter substrate.

That is, as shown in FIG. 2, the marked column of sub-pixels 3 can be of one column only. For instance, the marked column of sub-pixels 3 is located at the left-most side of the color filter substrate. Obviously, in many cases, the aim to distinguish different rows can be achieved through one marked column of sub-pixels 3, and therefore, in order to decrease the affect on the display effect, the number of the marked column of sub-pixels 3 should be as little as possible. If the marked column of sub-pixels 3 is located at the outermost of the color filter substrate, it is easy to be found and convenient for identification.

Of course, it is feasible to present many marked columns of sub-pixels 3, or it is also feasible that the marked column of sub-pixels 3 is located at other positions than the outermost of the color filter substrate (such as, middle position). For example, many marked columns of sub-pixels 3 may exist, the row numbers of the marked sub-pixels 12 in different columns of the marked columns of sub-pixels 3 are different, the marked sub-pixel 12 in the first marked column of sub-pixels 3 is located in the first row, the marked sub-pixel 12 in the second marked column of sub-pixels 3 is located in the second row, and so on. In this way, more accurate determination can be made through cooperation of many marked columns of sub-pixels 3 (for instance, the specific column number where the failure occurs can be determined).

Another embodiment of the present invention provides a display device, which comprises the above color filter substrate.

The display device may be any product or part with display function, such as an Organic Light-Emitting Diode (OLED) display device, a liquid crystal display device, an electronic paper, a mobile phone, a tablet computer, a TV set, a display, a laptop computer, a digital photo frame, a navigator etc., which will not be defined in detail here.

The display device may further comprise an array substrate to be assembled with the color filter substrate. The array substrate comprises many gate lines and two GOA circuits, each gate line corresponds to one row of the sub-pixels of the color filter substrate, one of the two GOA circuits drives odd rows of gate lines, and the other drives even rows of gate lines. In this case, for instance, in the color filter substrate, the above standard sub-pixels 11 and marked sub-pixels 12 are arranged in the marked column of sub-pixels 3 alternately.

That is, the color filter substrate of the embodiment can be used in the display device which adopts double side GOA circuits.

Another embodiment of the present invention provides a detection method for the display device, the display device is the above display device which adopts double side GOA circuits, the detection method specifically comprises: during the detection process, odd rows and even rows in the display device are distinguished through the marked sub-pixels 12 of the marked column of sub-pixels 3.

That is, during the detection process for the display device which adopts double side GOA circuits, if the GOA circuit on one side occurs failure, interlaced display abnormality occurs from a certain position of the display panel, and at this time, whether the failure occurs in odd rows or even rows can be determined as long as it can be observed that the abnormal row corresponds to the standard sub-pixels 11 or the marked sub-pixels 12, thereby the GOA circuit occurring failure can be determined, thus directly detecting and analyzing the GOA circuit so as to achieve the aims of exactly positioning the failure and improving the detecting efficiency.

It can be appreciated that, the embodiments abovementioned are just exemplary embodiments adopted for illustrating the principle of the present invention, however, the present invention is not limited thereto. For those skilled in the art, various modifications and improvements can be made without departing from the spirit and essence of the present invention, which are also deemed to fall into the protection scope of the present invention.

The invention claimed is:

1. A color filter substrate, comprising a plurality of sub-pixels arranged in rows and columns, each of the plurality of sub-pixels is provided with a color filter, wherein,
    the plurality of sub-pixels include at least one marked column of sub-pixels, and shapes of the color filters of a part of sub-pixels in the marked column of sub-pixels are different from those of remaining sub-pixels, other than the part of sub-pixels, in the marked column of sub-pixels.

2. The color filter substrate of claim 1, wherein,
    the part of sub-pixels in the marked column of sub-pixels are standard sub-pixels, and the remaining sub-pixels are marked sub-pixels, and
    the shapes of the color filters of the standard sub-pixels are the same.

3. The color filter substrate of claim 2, wherein,
    in the marked column of sub-pixels, at least one marked sub-pixel is provided every N standard sub-pixels, wherein N is a positive integer.

4. The color filter substrate of claim 3, wherein,
    N is 1, and one marked sub-pixel is provided every one standard sub-pixel.

5. The color filter substrate of claim 2, wherein,
the marked sub-pixels are divided into at least two types, and the shapes of the color filters of the marked sub-pixels of different types are different.

6. The color filter substrate of claim 2, wherein,
the shapes of the color filters of the marked sub-pixels are the same.

7. The color filter substrate of claim 2, wherein,
sub-pixels other than those in the marked column of sub-pixels are the standard sub-pixels.

8. The color filter substrate of claim 1, wherein,
the marked column of sub-pixels is one column of sub-pixels.

9. The color filter substrate of claim 8, wherein,
the marked column of sub-pixels is one of the two columns of sub-pixels at the outermost of the color filter substrate.

10. The color filter substrate of claim 1, wherein,
colors of the color filters of the same column of sub-pixels are the same.

11. A display device comprising a color filter substrate, wherein the color filter substrate comprises a plurality of sub-pixels arranged in rows and columns, each of the plurality of sub-pixels is provided with a color filter, wherein,
the plurality of sub-pixels include at least one marked column of sub-pixels, and shapes of the color filters of a part of sub-pixels in the marked column of sub-pixels are different from those of remaining sub-pixels, other than the part of sub-pixels, in the marked column of sub-pixels.

12. The display device of claim 11, wherein,
the part of sub-pixels in the marked column of sub-pixels are standard sub-pixels, and the remaining sub-pixels are marked sub-pixels, and
the shapes of the color filters of the standard sub-pixels are the same.

13. The display device of claim 12, wherein,
in the marked column of sub-pixels, at least one marked sub-pixel is provided every N standard sub-pixels, wherein N is a positive integer.

14. The display device of claim 13, wherein,
N is 1, and one marked sub-pixel is provided every one standard sub-pixel.

15. The display device of claim 12, wherein,
the marked sub-pixels are divided into at least two types, and the shapes of the color filters of the marked sub-pixels of different types are different.

16. The display device of claim 12, wherein,
the shapes of the color filters of the marked sub-pixels are the same.

17. The display device of claim 12, wherein,
sub-pixels other than those in the marked column of sub-pixels are the standard sub-pixels.

18. The display device of claim 11, wherein,
the marked column of sub-pixels is one column of sub-pixels.

19. The display device of claim 14, further comprising an array substrate to be assembled with the color filter substrate, wherein,
the array substrate comprises a plurality of gate lines and two GOA circuits, each gate line corresponds to a row of sub-pixels of the color filter substrate, one of the two GOA circuits drives the gate lines of odd rows, and the other drives the gate lines of even rows.

20. A detecting method for a display device which is the display device of claim 19, the detecting method for the display device comprising:
during a detection process, odd rows and even rows of the display device are distinguished through the marked sub-pixels of the marked columns of sub-pixels.

* * * * *